(12) United States Patent
Zhou et al.

(10) Patent No.: US 11,239,263 B2
(45) Date of Patent: Feb. 1, 2022

(54) THIN FILM TRANSISTOR, METHOD FOR MANUFACTURING THEREOF AND DISPLAY DEVICE

(71) Applicant: BOE TECHNOLOGY GROUP CO., LTD., Beijing (CN)

(72) Inventors: Tianmin Zhou, Beijing (CN); Wei Yang, Beijing (CN); Lizhong Wang, Beijing (CN); Xiaming Zhu, Beijing (CN); Jipeng Song, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 773 days.

(21) Appl. No.: 16/074,283

(22) PCT Filed: Jan. 23, 2018

(86) PCT No.: PCT/CN2018/073834
§ 371 (c)(1),
(2) Date: Jul. 31, 2018

(87) PCT Pub. No.: WO2019/015287
PCT Pub. Date: Jan. 24, 2019

(65) Prior Publication Data
US 2021/0210529 A1 Jul. 8, 2021

(30) Foreign Application Priority Data
Jul. 17, 2017 (CN) .......................... 201710581306.4

(51) Int. Cl.
*H01L 27/12* (2006.01)
*H01L 29/786* (2006.01)
*H01L 33/44* (2010.01)

(52) U.S. Cl.
CPC ...... *H01L 27/1262* (2013.01); *H01L 27/1218* (2013.01); *H01L 29/78618* (2013.01); *H01L 33/44* (2013.01)

(58) Field of Classification Search
CPC ............... H01L 29/78618; H01L 33/44; H01L 27/1262
See application file for complete search history.

(56) References Cited

U.S. PATENT DOCUMENTS 6,232,158 B1 * 5/2001 Lee ................... H01L 29/41733
257/E21.414
7,619,608 B2 * 11/2009 Lee ........................ G02F 1/167
345/107
(Continued)

FOREIGN PATENT DOCUMENTS

| CN | 1575525 A | 2/2005 |
|---|---|---|
| CN | 103676354 A | 3/2014 |

(Continued)

OTHER PUBLICATIONS

International Search Report of PCT/CN2018/073834 in Chinese, dated Apr. 19, 2018 with English translation.
(Continued)

*Primary Examiner* — David A Zarneke
(74) *Attorney, Agent, or Firm* — Collard & Roe, P.C.

(57) ABSTRACT

A thin film transistor, a method for manufacturing the same and a display device are disclosed. The thin film transistor includes source-drain electrodes and a passivation layer; an isolation layer is disposed between the source-drain electrodes and the passivation layer, and the isolation layer overlays the source-drain electrodes.

19 Claims, 7 Drawing Sheets

(56) References Cited

U.S. PATENT DOCUMENTS

| | | | | |
|---|---|---|---|---|
| 8,198,657 | B2* | 6/2012 | Lee | H01L 27/124 257/208 |
| 8,319,223 | B2 | 11/2012 | Kim et al. | |
| 8,389,991 | B2* | 3/2013 | Morosawa | H01L 29/78606 257/59 |
| 8,441,425 | B2* | 5/2013 | Ishitani | H01L 29/7869 345/92 |
| 8,502,225 | B2* | 8/2013 | Yamazaki | H01L 29/7869 257/59 |
| 8,557,641 | B2* | 10/2013 | Sasaki | H01L 21/02565 438/149 |
| 9,443,984 | B2* | 9/2016 | Yamazaki | H01L 29/7869 |
| 9,508,762 | B2* | 11/2016 | Liu | H01L 27/1248 |
| 9,685,463 | B2* | 6/2017 | Wang | H01L 29/66969 |
| 9,761,615 | B2* | 9/2017 | Jiang | H01L 21/76816 |
| 9,837,547 | B2* | 12/2017 | Koezuka | H01L 21/02631 |
| 9,929,279 | B2* | 3/2018 | Yamazaki | H01L 29/78606 |
| 2002/0027621 | A1 | 3/2002 | Chae | |
| 2003/0076452 | A1 | 4/2003 | Kim et al. | |
| 2011/0068340 | A1 | 3/2011 | Lee et al. | |
| 2012/0181532 | A1 | 7/2012 | Lin et al. | |
| 2014/0159070 | A1 | 6/2014 | Hoka et al. | |
| 2014/0175435 | A1* | 6/2014 | Yamazaki | H01L 29/66969 257/43 |
| 2014/0339539 | A1* | 11/2014 | Yamazaki | H01L 27/1225 257/43 |
| 2015/0021630 | A1 | 1/2015 | Jang et al. | |
| 2015/0171111 | A1 | 6/2015 | Hong | |
| 2016/0041433 | A1 | 2/2016 | Zhang et al. | |
| 2016/0043101 | A1 | 2/2016 | Liu | |
| 2020/0058796 | A1* | 2/2020 | Chien | H01L 27/1244 |

FOREIGN PATENT DOCUMENTS

| | | |
|---|---|---|
| CN | 103681696 A | 3/2014 |
| CN | 104064567 A | 9/2014 |
| CN | 107369716 A | 11/2017 |

OTHER PUBLICATIONS

Notice of Transmittal of the International Search Report of PCT/CN2018/073834 in Chinese, dated Apr. 19, 2018.

Written Opinion of the International Searching Authority of PCT/CN2018/073834 in Chinese, dated Apr. 19, 2018 with English translation.

Second Chinese Office Action in Chinese Application No. 201410415652.1 dated Jan. 13, 2017 with English translation.

First Office Action in U.S. Appl. No. 14/769,658 dated Oct. 17, 2016.

First Office Action in U.S. Appl. No. 15/138,971 dated Sep. 28, 2016.

Ex Parte Quayle Action in U.S. Appl. No. 15/068,928 dated Aug. 15, 2016.

* cited by examiner

THIN FILM TRANSISTOR, METHOD FOR MANUFACTURING THEREOF AND DISPLAY DEVICE

CROSS REFERENCE TO RELATED APPLICATIONS

This application is the National Stage of PCT/CN2018/073834 filed on Jan. 23, 2018, which claims priority under 35 U.S.C. § 119 of Chinese Application No. 201710581306.4 filed on Jul. 17, 2017, the disclosure of which is incorporated by reference.

TECHNICAL FIELD

Embodiments of the present disclosure relate to a thin film transistor, a method for manufacturing the same and a display device.

BACKGROUND

In the back channel etch (BCE) structure of oxide thin film transistors (TFTs), the processing of the back channel region plays a very important role, and the active layer of the TFTs is apt to become an electrical conductor, due to the damage of the back channel region during the etching process.

SUMMARY

At least one object of the present disclosure is to solve the problem that the source-drain metal layer is easily oxidized when the BCE structure of the oxide thin film transistor undergoes a passivation treatment, especially to solve the problem that the metal copper with high conductivity is more easily oxidized when the deposition temperature of the passivation layer is increased.

According to first aspect of the present invention, it is provided a thin film transistor, comprising: source-drain electrodes and a passivation layer; wherein an isolation layer is disposed between the source-drain electrodes and the passivation layer, and the isolation layer overlays the source-drain electrodes.

As an example, the isolation layer further overlays a channel region between the source-drain electrodes.

As an example, the isolation layer is made from silicon oxide with a molar ratio of silicon to oxygen from 1:1.1 to 1:1.4 or made from aluminum oxide.

As an example, a thickness of the isolation layer is ranged from 20 Å to 500 Å.

As an example, the passivation layer is made from silicon oxide with molar ratio of silicon to oxygen from 1:1.6 to 1:2.

As an example, the thin film transistor further comprises a substrate, the source-drain electrodes and the isolation layer are sequentially disposed on the substrate, and orthographic projections of the source-drain electrodes and the channel region on the substrate are within an orthographic projection of the isolation layer on the substrate.

According to second aspect of the present invention, it is provided a display device, comprising the afore-mentioned thin film transistor.

According to third aspect of the present invention, it is provided a method for manufacturing a thin film transistor, comprising: forming a substrate which comprises source-drain electrodes; and forming an isolation layer which overlays the source-drain electrodes.

As an example, the isolation layer further overlays a channel region between the source-drain electrodes.

As an example, orthographic projections of the source-drain electrodes and the channel region on the substrate are within an orthographic projection of the isolation layer on the substrate.

As an example, before forming the isolation layer which overlays the source-drain electrodes and the channel region between the source-drain electrodes, the method further comprises: performing a plasma treatment on the source-drain electrodes and the channel region.

As an example, the method further comprises: forming a passivation layer on the isolation layer.

As an example, after forming the isolation layer which overlays the source-drain electrodes and the channel region between the source-drain electrodes, and before forming the passivation layer on the isolation layer, the method further comprises: performing a plasma treatment on the isolation layer.

As an example, a plasma gas in the plasma treatment is an N2O plasma.

As an example, after forming the passivation layer, the method further comprises: performing an annealing process on the passivation layer.

As an example, formation of the isolation layer which overlays the source-drain electrodes and the channel region between the source-drain electrodes comprises: introducing $SiH_4$ and $N_2O$ with a flow ratio equal to or more than 1:40 at a temperature of 170° C. to 200° C., and forming the isolation layer of silicon oxide with a thickness of 100 Å to 500 Å by a plasma enhanced chemical vapor deposition process.

As an example, formation of the isolation layer which overlays the source-drain electrodes and the channel region between the source-drain electrodes comprises: forming the isolation layer of aluminum oxide with a thickness of 20 Å to 100 Å at a temperature of 180° C. to 220° C. by an atomic layer deposition process or a plasma enhanced atomic layer deposition process.

As an example, after forming the isolation layer, the method further comprises: introducing $SiH_4$ and $N_2O$ with a flow ratio equal to or less than 1:90, at a temperature of 240° C. to 280° C., and forming the passivation layer with a thickness of 500 Å to 1500 Å.

As an example, after forming the passivation layer, the method further comprises: performing the annealing process on the passivation layer at a temperature of 250° C. to 350° C.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 10:
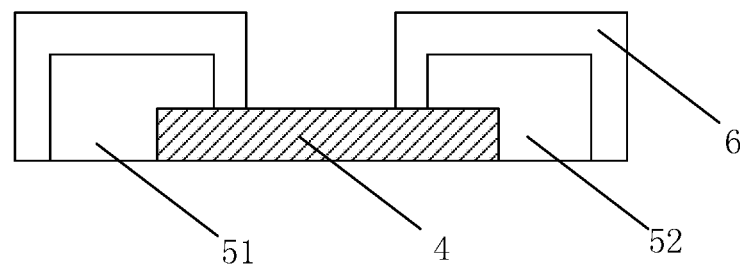
FIG. 10 schematically illustrates another thin film transistor according to an embodiment of the present disclosure.

An embodiment of the present disclosure provides a thin film transistor, which comprises source-drain electrodes and a passivation layer; an isolation layer is disposed between the source-drain electrodes and the passivation layer, and the isolation layer overlays the source-drain electrodes. As illustrated in FIG. 10, an isolation layer 6 is formed on the source-drain electrodes 51, 52, the isolation layer 6 is in contact with outer surfaces of the source-drain electrodes 51, 52, and completely overlays the source-drain electrodes.

By forming the isolation layer on the source-drain electrodes, the source-drain electrodes are less likely to be oxidized in a subsequent process, and in particular, the problem that the source-drain electrodes made of the copper is easily oxidized in a subsequent high-temperature passivation process is solved.

In other embodiments of the present disclosure, the isolation layer further overlays a channel region between the source-drain electrodes. The following will be described by taking an example that the isolation layer overlays the source-drain electrodes and the channel region.

Figure 1:
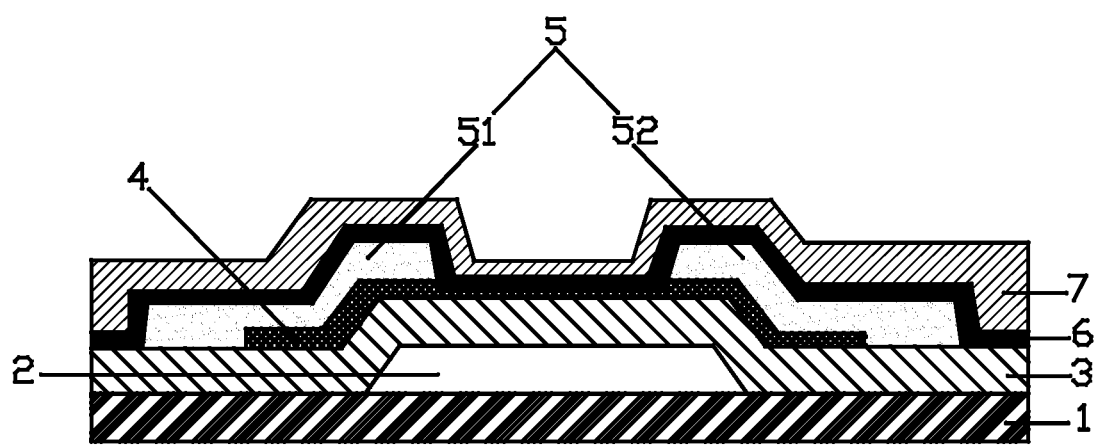
FIG. 1 schematically illustrates a thin film transistor according to an embodiment of the present disclosure.

For example, another embodiment of the present disclosure provides a thin film transistor (TFT), as illustrated in FIG. 1, which comprises: a gate 2, a gate dielectric layer 3, an active layer 4, source-drain electrodes 5 and a passivation layer 7; an isolation layer 6 is disposed between the source-drain electrodes 5 and the passivation layer 7, and the isolation layer 6 overlays the source-electrodes 5 and a channel region between the source-drain electrodes 5.

In the illustrated embodiment, the gate 2, the gate dielectric layer 3, the active layer 4, the source-drain electrodes 5, the isolation layer 6 and the passivation layer 7 are sequentially disposed on the substrate 1, and the isolation layer 6 respectively overlays the source electrode 51, the drain electrode 52 and the channel region between the source electrode 51 and the drain electrode 52, so that the source-drain electrodes 5 is not easily oxidized when the passivation layer 7 is subsequently deposited; especially in the case that the deposition temperature of the passivation layer is relatively higher, the isolation layer 6 can protects the source electrode 51 and the drain electrode 52 from being easily oxidized, which stable the electrical characteristics of the TFT are stabilized.

In the back channel etch (BCE) structure of an oxide thin film transistor, the EPM characteristics of the TFT is greatly affected by the deposition temperature of the passivation layer. If the deposition temperature of the passivation layer is increased, the reliability of the TFT can be effectively increased. By adopting the structure provided in embodiments of the present disclosure, the deposition temperature of the passivation layer can be increased, and the reliability of the TFT can be increased; meanwhile, in case that the source-drain electrodes are made of the metal cooper which has high conductivity, the problem that the cooper is easily oxidized can also be solved due to the protection effect of the isolation layer 6.

In at least some embodiments, the isolation layer 6 overlays the entire source-drain electrodes 51, 52 and the entire channel region. Alternatively, the isolation layer 6 at least overlays the entire source-drain electrodes 51, 52 and the entire channel region. The isolation layer 6 directly contacts with the source-drain electrodes 51, 52.

In at least some embodiments, orthographic projections of the source-drain electrodes 51, 52 and the channel region on the substrate 1 are within the orthographic projection of the isolation layer 6 on the substrate 1. In other embodiments, the orthographic projections of the source-drain electrodes 51, 52 and the channel region on the substrate 1 are completely overlap the orthographic projection of the isolation layer 6 on the substrate 1.

Figure 3:
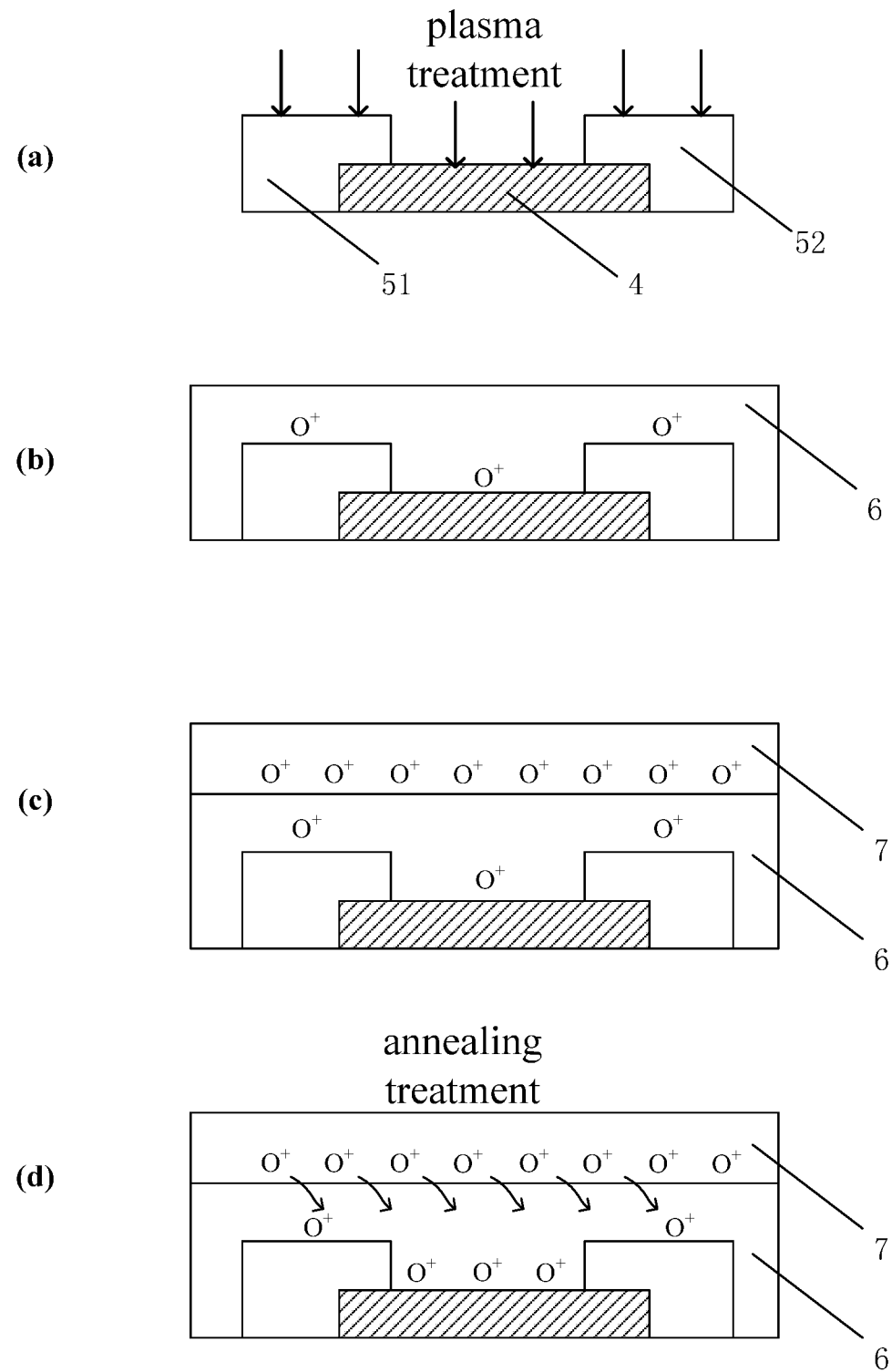
FIGS. 3a to 3d schematically illustrate a thin film transistor in each step of a method for manufacturing the same according to an embodiment of the present disclosure.
Figure 4:
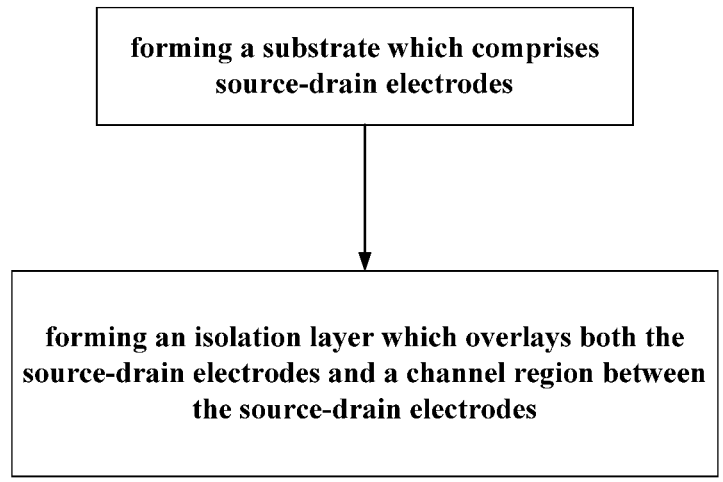
FIG. 4 schematically illustrates a flow chart of a method for manufacturing a thin film transistor according to an embodiment of the present disclosure.

In at least some embodiments, in order to allow the oxygen ions in the passivation layer 7 to penetrate into the back channel region more uniformly, and to improve the EPM characteristics of the TFT, the isolation layer 6 may be a silicon oxide layer with low oxygen content or an aluminum oxide layer. For example, the material of the isolation layer 6 comprises silicon oxide with a molar ratio of silicon to oxygen ranging from 1:1.1 to 1:1.4 or aluminum oxide. Because the oxygen ions in the silicon oxide or aluminum oxide are relatively less, for example, the oxygen ion concentration in the silicon oxide or the aluminum oxide is lower than the oxygen ion concentration in the passivation layer 7, the free oxygen ions in the passivation layer 7 penetrate into the back channel region, as illustrated in FIGS. 3 and 4, as a result, the distribution of oxygen ions in the back channel region is more uniform, and the defects in the interface region is reduced.

In at least some embodiments, in order to optimize the penetration uniformity of oxygen ions, the passivation layer 7 may be a silicon oxide layer with high oxygen content. For example, the material of the passivation layer 7 comprises silicon oxide with a molar ratio of silicon to oxygen ranging from 1:1.6 to 1:2. In practical application, the substrate 1 is a glass substrate, and the passivation layer 7 is deposited by a plasma chemical vapor deposition with faster deposition rate, as a result, the passivation layer 7 may be uneven, and have too excessive or too little oxygen ions in some regions; at this time, the isolation layer 6 can function as a dispersion to slowly diffuse free oxygen ions to the back channel region, in this way, the interface defects are reduced and the characteristics of the TFT can be increased. The isolation layer is made of silicon oxide with low oxygen content or aluminum oxide, and the passivation layer is made of silicon oxide with high oxygen content, so that oxygen ions in the passivation layer can penetrate into the back channel region more uniformly, and the EPM characteristics of the TFT are increased.

In at least some embodiments, the thickness of the isolation layer 6 is from 20 Å to 500 Å. For example, while the isolation layer 6 is made of silicon oxide with low oxygen content, that is, silicon oxide with a molar ratio of silicon to oxygen ranging from 1:1.1 to 1:1.4, the thickness of the isolation layer 6 may be from 200 Å to 400 Å; while the isolation layer is made of aluminum oxide ($Al_2O_3$), the thickness of the isolation layer 6 may be from 30 Å to 100 Å.

In at least some embodiments, after the etching of the source-drain metal channel region is completed, the isolation layer 6 is deposited by evaporation equipment. For example, in condition that the isolation layer 6 is the silicon oxide layer with low oxygen content, chemical vapor deposition equipment may be used; and in condition that the isolation 6 is the aluminum oxide layer, equipment having an atomic deposition chamber may be used. After the isolation layer 6 is deposited at a lower evaporation temperature, the isolation layer 6 is subjected to a plasma treatment, and then a passivation layer is deposited. For example, the passivation layer is selected to be the silicon oxide layer with high oxygen content, and have a high deposition temperature. Optionally, after the deposition, the passivation layer is annealed. In order to reduce the damage of the back channel region of the TFT from etching, and to avoid the active layer of TFT from becoming electro-conductive, a step of plasma treatment is added before the passivation layer is formed, so that the channel region is further subjected to the plasma treatment, which can effectively compensate for the defect state caused by etching, and increase the electrical characteristics of the TFT.

In the thin film transistor provided in above embodiments of the present disclosure, the source electrode 51, the drain electrode 52 and the channel region between the source electrode 51 and the drain electrode 52 are prevented from being directly exposed to the high temperature and high oxygen atmosphere while the passivation layer is formed, thus the possibility of oxidation is reduced. Moreover, in the channel region between the source electrode 51 and the drain electrode 52, oxygen ions in the passivation layer can be more uniformly penetrated into the back channel region due to the presence of the isolation layer 6 with low oxygen content, and then the EPM characteristics of TFT is increased.

An embodiment of the present disclosure further provides an array substrate, which comprises the thin film transistor described in above embodiments.

Figure 2:
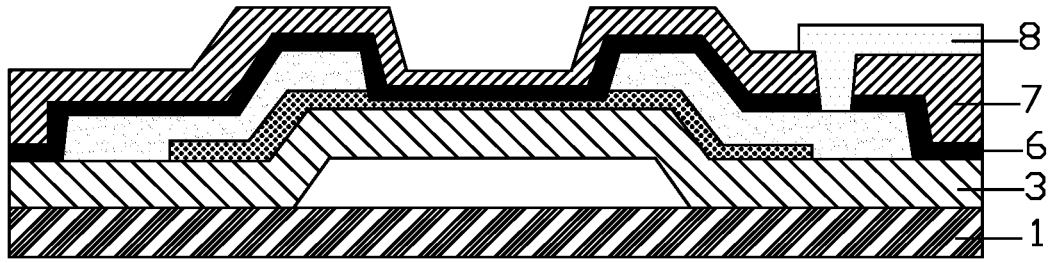
FIG. 2 schematically illustrates a thin film transistor and an electrical conductive film according to an embodiment of the present disclosure.

In at least some embodiments, the array substrate further comprises an electrode formed on the passivation layer. For example, as illustrated in FIG. 2, the drain electrode 52 of TFT may be electrically connected with an electrical conductive film 8 to serve as a switch for inputting control voltage to the conductive film 8. The conductive film 8 is, for example, a pixel electrode on the array substrate, and it is made of, for example, indium tin oxide.

An embodiment of the present disclosure further provides a display device, which comprises the thin film transistor or the array substrate described in above embodiments.

An embodiment of the present disclosure further provides a method for manufacturing a thin film transistor, as illustrated in FIG. 4, which comprises: forming a substrate which comprises source-drain electrodes 5, and forming an isolation layer 6 which overlays both the source-drain electrodes 5 and a channel region between the source-drain electrodes 5. In the method for manufacturing the thin film transistor provided in embodiments of the present disclosure, it can be contemplated that the isolation layer 6 may also be formed only on the source-drain electrodes 5, as illustrated in FIG. 10.

In at least some embodiments, before forming the isolation layer 6 which overlays both the source-drain electrodes 5 and the channel region between the source-drain electrodes 5, the method further comprises: performing a plasma treatment on the source-drain electrodes 5 and the channel region.

In at least some embodiments, the method further comprises: forming a passivation layer 7 on the isolation layer 6.

In at least some embodiments, after forming the isolation layer 6 which overlays both the source-drain electrodes 5 and the channel region between the source-drain electrodes 5, and before forming the passivation layer 7 on the isolation layer 6, the method further comprises: performing a plasma treatment on the isolation layer 6. In the present embodiment, the plasma in the plasma treatment is, for example, $N_2O$ plasma.

As described in above embodiments, the isolation layer 6 is made from silicon oxide with a molar ratio of silicon to oxygen ranging from 1:1.1 to 1:1.4 or aluminum oxide. The specific material and thickness of the isolation layer, and the material of the passivation layer may be referred to the above embodiments, which are not described herein.

In embodiments of the present disclosure, a process for forming the isolation layer 6 comprises, but is not limited to, plasma enhanced chemical vapor deposition, atomic layer deposition. The process for forming the passivation layer may be various, for example, thermal evaporation, plasma enhanced chemical vapor deposition, atomic layer deposition, sputtering evaporation, and so on. Several examples of manufacturing the thin film transistor or array substrate are described below.

Example 1

Figure 5:
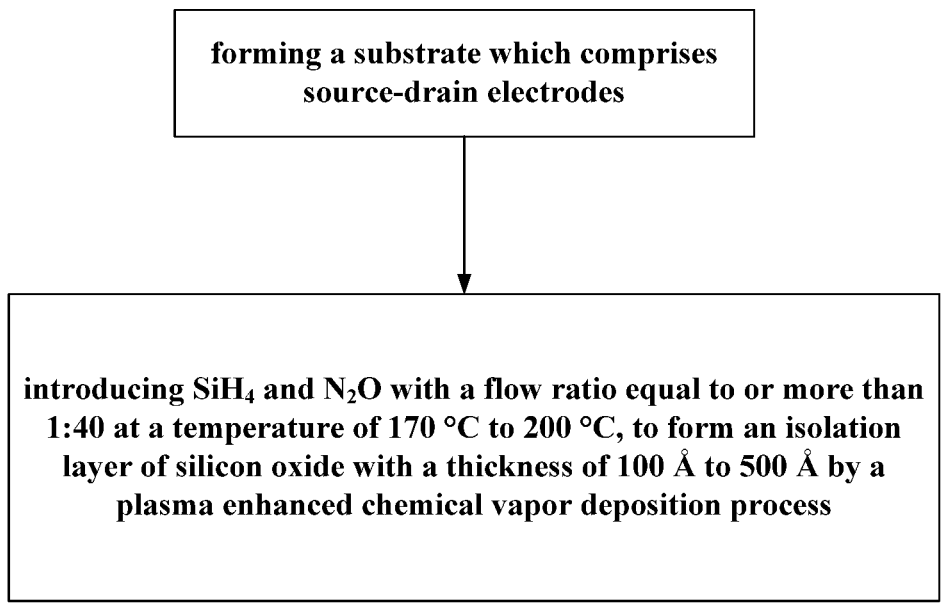
FIG. 5 schematically illustrates a flow chart of a method for manufacturing an isolation layer according to an embodiment of the present disclosure.

As illustrated in FIG. 5, according to the present example, the method for manufacturing the thin film transistor comprises: forming a substrate which comprises source-drain electrodes; introducing $SiH_4$ and $N_2O$ with a flow ratio equal to or more than 1:40 at a temperature of 170° C. to 200° C.; and forming an isolation layer of silicon oxide with a thickness of 100 Å to 500 Å by a plasma enhanced chemical vapor deposition process.

The actual process parameters for forming the isolation layer 6 of the silicon oxide are different in different devices. In actual preparation, PECVD equipment may be used, for example, the pressure is ranged from 70 Pa to 110 Pa, the power is ranged from 800 W to 1500 W, the reaction temperature is ranged from 170° C. to 200° C., such that $SiH_4$ reacts with $N_2O$, and the isolation layer 6 with a thickness of 100 Å to 500 Å is deposited on the surface of substrate. The deposition rates in different equipments are different from each other, so the reaction time of the reaction gas also differs from each other. For example, the reaction time of chemical vapor deposition equipment (CVD equipment) is ranged from 10 minutes to 30 minutes, for example, the reaction time of PECVD equipment is ranged from 1 minute to 5 minutes. For example, the reaction formula of $SiH_4$ and $N_2O$ is: $SiH_4+4N_2O \rightarrow SiO_2+2H_2O+4N_2$.

Figure 6:
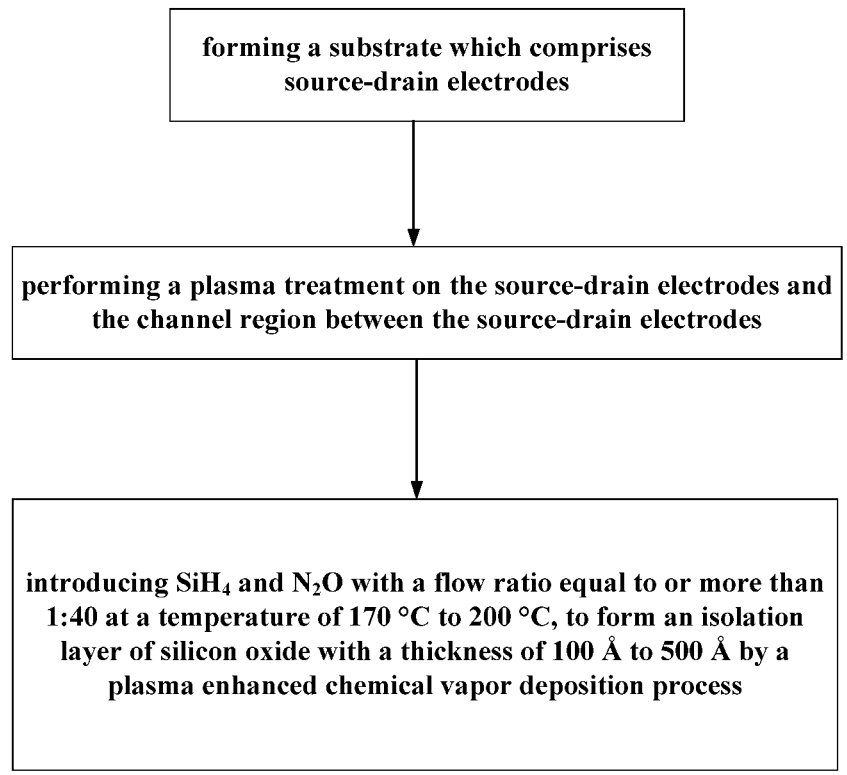
FIG. 6 schematically illustrates flow chart of a method for manufacturing an isolation layer according to an another embodiment of the present disclosure.

Optionally, as illustrated in FIG. 6, after etching the back channel region, the source-drain electrodes and the channel region between the source-drain electrodes may be first subjected to a plasma treatment (for example, $N_2O$ plasma treatment), to repair the defect of the back channel from etching; and then silicon oxide with low oxygen content is selected to form an isolation layer 6, the thickness of the isolation layer 6 is ranged from 100 Å to 500 Å, for example, between 200 Å and 400 Å.

Example 2

Figure 7:
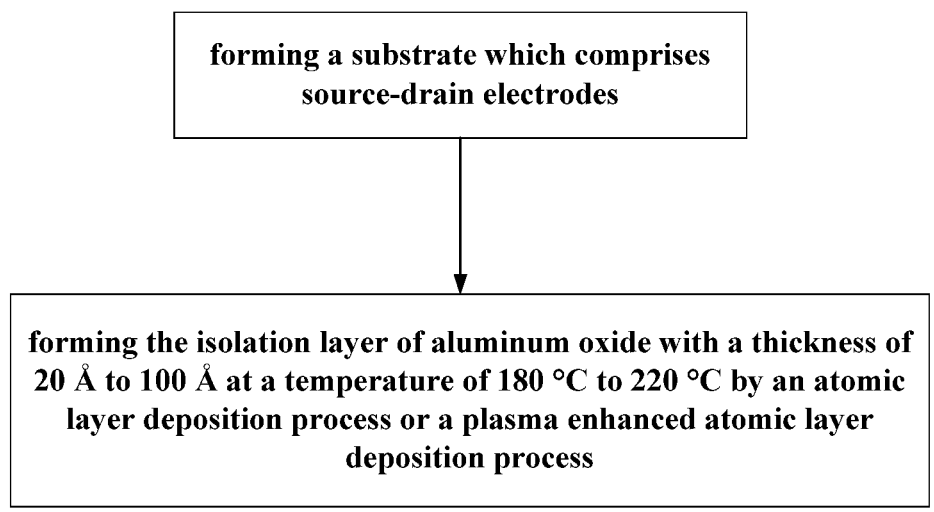
FIG. 7 schematically illustrates flow chart of a method for manufacturing an isolation layer according to a still another embodiment of the present disclosure.

As illustrated in FIG. 7, according to the present example, the method for manufacturing the thin film transistor comprises: forming a substrate which comprises source-drain electrodes; and forming an aluminum oxide isolation layer with a thickness of 20 Å to 100 Å at a temperature of 180° C. to 220° C. by an atomic layer deposition process or a plasma enhanced atomic layer deposition process.

For example, the reaction gas of aluminum oxide is trimethylaluminum gas and its oxidant, and the step of forming the aluminum oxide isolation layer comprises: introducing trimethylaluminum gas first; and then purifying the trimethylaluminum gas by inert gas; next, introducing any one of source gases, such as $H_2O$, $H_2O$ plasma, $O_2$ plasma, $O_3$ and other oxidizing agents to perform an evaporation reaction; the evaporation reaction may be repeated for several times.

The evaporation of aluminum oxide layer may be conducted in an atomic layer deposition (ALD) chamber. Because the deposition rate of the ALD technology is relatively slower, the thickness of the isolation layer 6 can be thinner, for example, from 20 Å to 100 Å, which may increase the efficiency of mass production. Depending on the specific characteristics of the isolation layer 6, the evaporation temperature is approximately 200° C., for example, from 180° C. to 220° C.

In order to increase the productivity, one chamber of a plasma chemical vapor deposition (PECVD) equipment may be used as a low temperature chamber (or the PECVD equipment is equipped with ALD chamber), which is configured to evaporate the isolation layer 6 at a low temperature. All of the substrates are first arranged in the low temperature chamber which is used for deposition of aluminum oxide layer, and then arranged in respective chemical vapor deposition (CVD) chambers for deposition of the passivation layer.

For example, the process of forming the aluminum oxide layer as the isolation layer 6 by the PECVD equipment comprises: firstly, introducing a trimethylaluminum source gas, and introducing any one of source gases such as $H_2O$, $H_2O$ plasma, $O_2$ plasma, $O_3$ and other oxidizing agents for reaction; secondly, introducing the trimethylaluminum source gas again, and introducing any one of source gases such as $H_2O$, $H_2O$ plasma, $O_2$ plasma, $O_3$ and other oxidizing agents for performing an evaporation reaction; the evaporation reaction may be repeated for several times, in order to form the aluminum oxide layer with a desired thickness. For example, after introducing the source gas for reaction, an inert gas for purification is introduced to purify the reaction gas, and the inert gas may be a conventional inert gas, such as Ar or the like.

Optionally, before forming the isolation layer 6, the plasma treatment (such as $N_2O$ plasma treatment) is performed on the source electrode and drain electrodes 51, 52 and the channel region between the source and drain electrodes, as illustrated in FIG. 3*a*.

Figure 8:
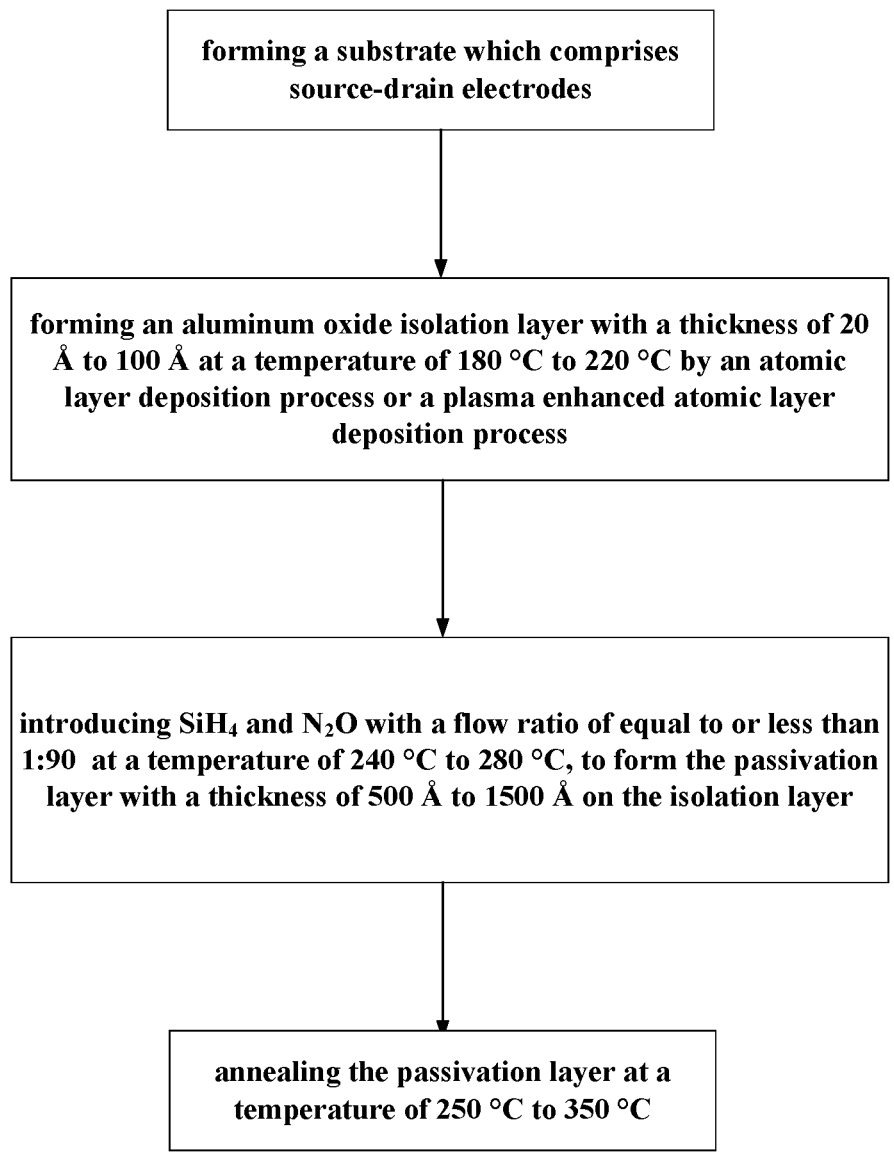
FIG. 8 schematically illustrates a flow chart of a method for manufacturing an isolation layer and a passivation layer according to an embodiment of the present disclosure.

Optionally, as illustrated in FIG. 8, after forming the isolation layer 6 (illustrated in FIG. 3*b*), the passivation layer may be deposited at a high temperature, as illustrated in FIG. 3*c*. The passivation layer 7 is made from silicon oxide with high oxygen content, $SiH_4$ and $N_2O$ with a flow ratio of equal to or less than 1:90 are introduced at a temperature of 240° C. to 280° C., to form the passivation layer 7 with a thickness of 500 Å to 1500 Å on the isolation layer 6.

Optionally, after depositing the passivation layer, an annealing process is performed, as illustrated in FIG. 3*d*. For example, the annealing temperature is approximately 300° C., or may be from 250° C. to 350° C.

In order to increase the stability of the passivation layer 7, another passivation layer (PVX2) may be deposited on the passivation layer (PVX1), and then a via hole is formed in and penetrates through the passivation layers PVX1 and PVX2, next, an electrical conductive film 8 is formed in the via hole, to electrically connect the conductive film 8 with the drain electrode.

Example 3

Figure 9:
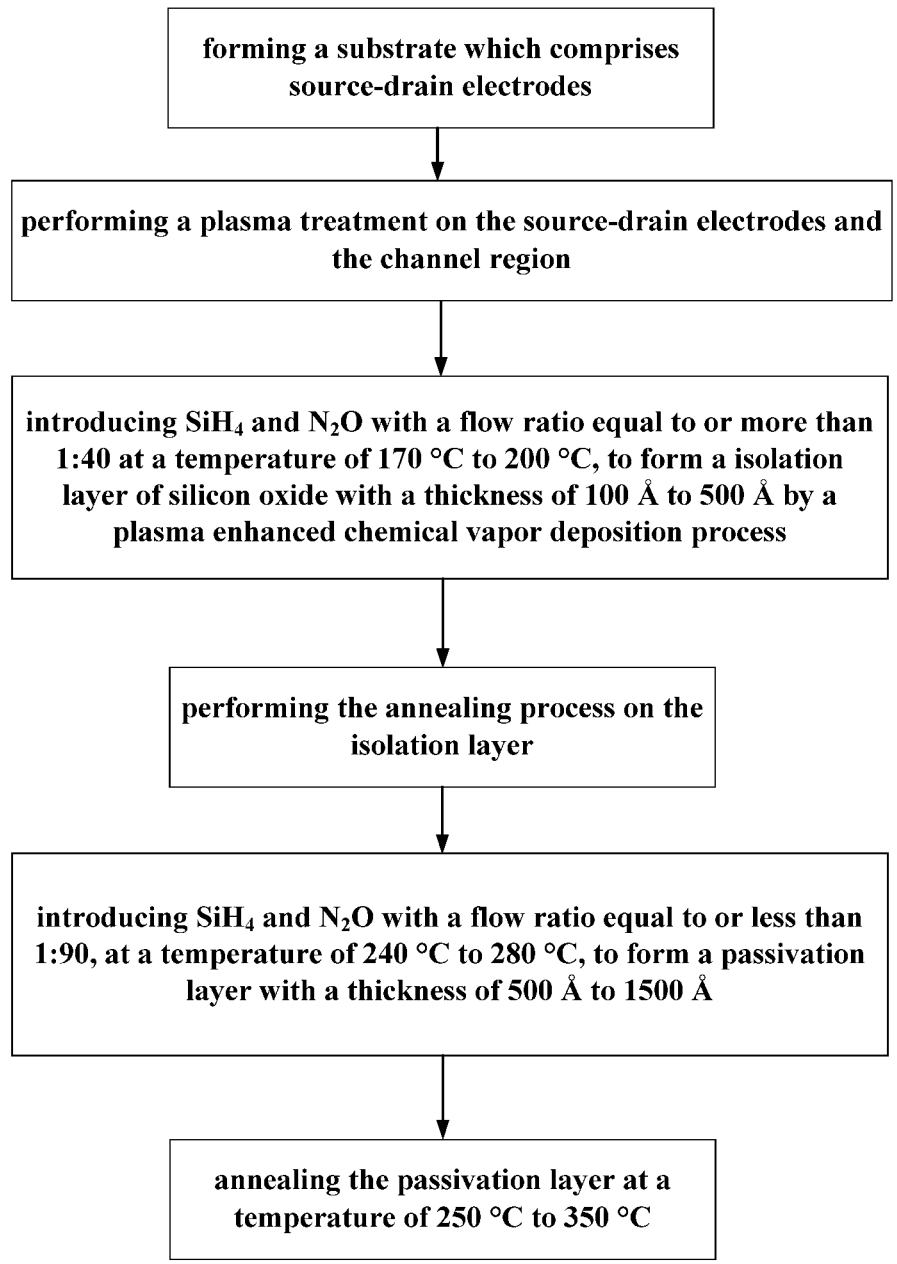
FIG. 9 schematically illustrates flow chart of a method for manufacturing an isolation layer and a passivation layer according to another embodiment of the present disclosure.

As illustrated in FIG. 9, after deposition of the active layer 4 and the source-drain electrodes 5, an $N_2O$ plasma treatment is first performed on the source-drain electrodes 5 and the channel region between the source-drain electrodes 5, and then an isolation layer 6 is deposited by CVD equipment; the isolation layer 6 is made from low-temperature low-oxygen content silicon oxide, and the reaction gas thereof comprises $SiH_4$ and $N_2O$, the ratio of $SiH_4$ and $N_2O$ is equal to or more than 1:40, and the evaporation temperature is from 170° C. to 200° C. After the deposition of the isolation layer 6, a second $N_2O$ plasma treatment is performed on the isolation layer 6. After the second $N_2O$ plasma treatment, silicon oxide with high oxygen content is deposited as a passivation layer 7 at a higher temperature, for example, the passivation layer 7 with a thickness of 500 Å to 1500 Å is deposited on the isolation layer 6 by introducing $SiH_4$ and $N_2O$ with a flow ratio equal to or less than 1:90 into the PECVD equipment, under the temperature of 240° C. to 280° C. The reaction time is from 2 minutes to 7 minutes.

In each of the above embodiments, the evaporation temperature of the isolation layer is lower than the evaporation temperature of the passivation layer 7. In comparison with the situation that the passivation layer 7 is directly formed on the source-drain electrodes, the oxidation of the source-drain metal of the source-drain electrodes 5 during the process of forming the isolation layer 6 is significantly decreased. Moreover, due to the isolation of the isolation layer 6, the process flexibility of subsequent deposition of passivation layer 7 is higher, it is possible that the reliability of the entire passivation layer 7 is improved by increasing the deposition temperature of the passivation layer during the process. Furthermore, because the oxygen content of the isolation layer 6 is lower than that of the passivation layer 7, the oxygen ions as illustrated in FIGS. 3c and 3d are allowed to penetrate into the back channel region, thus the distribution of oxygen ions in the back channel region is more uniform, the defects in the interface region are reduced, and the EPM characteristics of TFT is increased.

In each of the above embodiments, before forming the isolation layer 6 on the substrate comprising the source-drain electrodes 5 and the isolation layer 6 overlying both the source-drain electrodes 5 and the channel between the source-drain electrodes, the method for manufacturing the thin film transistor further comprises: performing a plasma treatment on the source-drain electrodes 5 and the channel region. For example, after etching the source-drain electrodes 5, an $N_2O$ plasma treatment is first performed on the source-drain electrodes 5 and the channel region, so as to repair the defects from etching of the back channel region; and then the isolation layer 6 is evaporated. For example, after forming the isolation layer overlying the source-drain electrodes and the channel region therebetween, and before forming the passivation layer 7 on the isolation layer 6, the method for manufacturing then thin film transistor further comprises: performing a plasma treatment on the isolation layer 6. For example, after the evaporation of the isolation layer 6, an $N_2O$ plasma treatment is first performed, so as to repair the defects of the isolation layer 6, and then the passivation layer 7 is deposited. The passivation layer 7 is, for example, a silicon oxide layer, and a molar ratio of silicon to oxygen is from 1:1.6 to 1:2.

In each of the above embodiments, after the passivation layer 7 or the first layer of the passivation layer 7 is formed by the deposition process, the method for manufacturing the thin film transistor further comprises: annealing the passivation layer at a temperature of 250° C. to 350° C., to increase the bonding force between the layers.

In the present disclosure, the following points needs to explain:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness of a layer or area may be enlarged or narrowed, that is, the drawings are not drawn in a real scale.

(3) In case of no conflict, features in one embodiment or in different embodiments can be combined as a new embodiment.

Although the present disclosure has been described above in detail with reference to the preferred embodiments and the general description, it will be apparent to those skilled in the art that, modifications or improvements could be made thereto based on the embodiments of the present disclosure. Therefore, such modifications or improvements made without departing from the spirit of the present disclosure are intended to fall within the scope of the present disclosure.

The invention claimed is:

1. A thin film transistor, comprising: source-drain electrodes and a passivation layer; wherein an isolation layer is disposed between the source-drain electrodes and the passivation layer, and the isolation layer overlays the source-drain electrodes,
   wherein the isolation layer and the passivation layer are sequentially laminated on the source-drain electrodes, and
   wherein the isolation layer is made from silicon oxide, the passivation layer is made from silicon oxide, and an oxygen content of the isolation layer is lower than an oxygen content of the passivation layer.

2. The thin film transistor according to claim 1, wherein the isolation layer further overlays a channel region between the source-drain electrodes.

3. The thin film transistor according to claim 1, wherein the isolation layer is made from the silicon oxide with a molar ratio of silicon to oxygen from 1:1.1 to 1:1.4.

4. The thin film transistor according to claim 1, wherein a thickness of the isolation layer is ranged from 20 Å to 500 Å.

5. The thin film transistor according to claim 1, wherein the passivation layer is made from the silicon oxide with molar ratio of silicon to oxygen from 1:1.6 to 1:2.

6. The thin film transistor according to claim 2, wherein the thin film transistor further comprises a substrate, the source-drain electrodes and the isolation layer are sequentially disposed on the substrate, and orthographic projections of the source-drain electrodes and the channel region on the substrate are within an orthographic projection of the isolation layer on the substrate.

7. A display device, comprising: the thin film transistor according to claim 1.

8. A method for manufacturing a thin film transistor, comprising:
   forming a substrate which comprises source-drain electrodes;
   forming an isolation layer which overlays the source-drain electrodes; and
   forming a passivation layer on the isolation layer,
   wherein the isolation layer and the passivation layer are sequentially laminated on the source-drain electrodes, and
   wherein the isolation layer is made from silicon oxide, the passivation layer is made from silicon oxide, and an oxygen content of the isolation layer is lower than an oxygen content of the passivation layer.

9. The method for manufacturing the thin film transistor according to claim 8, wherein the isolation layer further overlays a channel region between the source-drain electrodes.

10. The method for manufacturing the thin film transistor according to claim 9, wherein orthographic projections of the source-drain electrodes and the channel region on the substrate are within an orthographic projection of the isolation layer on the substrate.

11. The method for manufacturing the thin film transistor according to claim 9, wherein before forming the isolation layer which overlays the source-drain electrodes and the channel region between the source-drain electrodes, the method further comprises: performing a plasma treatment on the source-drain electrodes and the channel region.

12. The method for manufacturing the thin film transistor according to claim 9, wherein after forming the isolation layer which overlays the source-drain electrodes and the channel region between the source-drain electrodes, and before forming the passivation layer on the isolation layer, the method further comprises: performing a plasma treatment on the isolation layer.

13. The method for manufacturing the thin film transistor according to claim 11, wherein a plasma gas in the plasma treatment is an $N_2O$ plasma.

14. The method for manufacturing the thin film transistor according to claim 9, wherein after forming the passivation layer, the method further comprises: performing an annealing process on the passivation layer.

15. The method for manufacturing the thin film transistor according to claim 9, wherein formation of the isolation layer which overlays the source-drain electrodes and the channel region between the source-drain electrodes comprises:

introducing $SiH_4$ and $N_2O$ with a flow ratio equal to or more than 1:40 at a temperature of 170° C. to 200° C., and forming the isolation layer of silicon oxide with a thickness of 100 Å to 500 Å by a plasma enhanced chemical vapor deposition process.

16. The method for manufacturing the thin film transistor according to claim 9, wherein formation of the isolation layer which overlays the source-drain electrodes and the channel region between the source-drain electrodes comprises:

forming the isolation layer of aluminum oxide with a thickness of 20 Å to 100 Å at a temperature of 180° C. to 220° C. by an atomic layer deposition process or a plasma enhanced atomic layer deposition process.

17. The method for manufacturing the thin film transistor according to claim 15, wherein after forming the isolation layer, the method further comprises:

introducing $SiH_4$ and $N_2O$ with a flow ratio equal to or less than 1:90, at a temperature of 240° C. to 280° C., and forming the passivation layer with a thickness of 500 Å to 1500 Å.

18. The method for manufacturing the thin film transistor according to claim 17, wherein after forming the passivation layer, the method further comprises: performing an annealing process on the passivation layer at a temperature of 250° C. to 350° C.

19. A thin film transistor, comprising:
source-drain electrodes and a passivation layer;
wherein an isolation layer is disposed between the source-drain electrodes and the passivation layer, and the isolation layer overlays the source-drain electrodes,
wherein an oxygen content of the isolation layer is lower than an oxygen content of the passivation layer.

* * * * *